(12) United States Patent
Hahakura et al.

(10) Patent No.: US 9,975,257 B2
(45) Date of Patent: May 22, 2018

(54) ROBOT

(71) Applicant: Seiko Epson Corporation, Tokyo (JP)

(72) Inventors: Seiji Hahakura, Azumino (JP); Masato Yokota, Matsumoto (JP)

(73) Assignee: Seiko Epson Corporation (JP)

(*) Notice: Subject to any disclaimer, the term of this patent is extended or adjusted under 35 U.S.C. 154(b) by 414 days.

(21) Appl. No.: 14/688,041

(22) Filed: Apr. 16, 2015

(65) Prior Publication Data

US 2015/0327396 A1  Nov. 12, 2015

(30) Foreign Application Priority Data

May 7, 2014  (JP) .................................. 2014-095735

(51) Int. Cl.
| | | |
|---|---|---|
| *B25J 19/00* | (2006.01) | |
| *H05K 7/20* | (2006.01) | |
| *B25J 9/00* | (2006.01) | |
| *B25J 9/04* | (2006.01) | |

(52) U.S. Cl.
CPC ......... *B25J 19/0054* (2013.01); *B25J 9/0012* (2013.01); *B25J 9/0018* (2013.01); *B25J 9/044* (2013.01); *H05K 7/2039* (2013.01); *Y10S 901/49* (2013.01)

(58) Field of Classification Search
CPC ........ B25J 9/0012; B25J 9/0018; B25J 9/044; B25J 9/054; H02K 7/2039

USPC ................... 74/490.03; 901/23, 50
See application file for complete search history.

(56) References Cited

U.S. PATENT DOCUMENTS

| | | | | |
|---|---|---|---|---|
| 4,931,617 A | * | 6/1990 | Toyoda .................. | B23K 9/287 901/42 |
| 5,132,601 A | * | 7/1992 | Ohtani ..................... | B25J 9/046 318/567 |
| 8,910,538 B2 | * | 12/2014 | Hayashi ................. | B25J 9/0009 74/490.05 |
| 2009/0114052 A1 | * | 5/2009 | Haniya ................... | B25J 9/0087 74/490.03 |

FOREIGN PATENT DOCUMENTS

| | | | |
|---|---|---|---|
| JP | 09-323286 A | | 12/1997 |
| JP | 2006-167843 | * | 6/2006 |
| JP | 2007-276067 A | | 10/2007 |
| JP | 2010-221310 A | | 10/2010 |
| JP | 2010-221340 A | | 10/2010 |
| JP | 2012-232362 | * | 11/2012 |

* cited by examiner

*Primary Examiner* — William C Joyce
(74) *Attorney, Agent, or Firm* — Harness, Dickey & Pierce, P.L.C.

(57) ABSTRACT

A ceiling mounted robot includes a first arm portion, and a second motor that is provided in the first arm portion. The first arm portion has a first heat dissipation path limiting portion, and a first heat dissipation portion that is in contact with the first heat dissipation path limiting portion and has thermal conductivity higher than that of the first heat dissipation path limiting portion. The first heat dissipation portion is in contact with the second motor.

6 Claims, 6 Drawing Sheets

ROBOT

BACKGROUND

1. Technical Field

The present invention relates to a robot.

2. Related Art

Typically, an industrial robot with an articulated arm is installed on the ground, and for example, is configured in such a manner as to assemble a predetermined structural body on a work bed. The movement envelope of the articulated arm excludes an envelope in which the articulated arm interferes with a base of the industrial robot installed on the ground.

The ceiling mounted robot is an industrial robot, the base of which is installed on a ceiling so as to avoid interference between the articulated arm and the base. This articulated arm can have a wide movement envelope around the base of 360° or greater.

In recent years, attempts have been made to increase the motion speed and reduce the non-operation time of such an industrial robot so as to cope with the demand for productivity improvement in association with the use of the industrial robot. However, a high motion speed increases the amount of heat generation of a drive unit such as a motor, and a reduced non-operation time reduces the cooling time of the drive unit, which is a deficiency. When the temperature of the drive unit increases, and the temperature increase outpaces the heat dissipation capacity of the industrial robot, and exceeds a predetermined reference value for maintaining the performance and the life span of the drive unit, a countermeasure of decreasing the motion speed below the capacity of the industrial robot, or increasing a run-down time is taken.

JP-A-9-323286 discloses a method of cooling a drive motor of an industrial robot. In this method, the motor is attached to a robot main body having thermal conductive properties via a flange, and the motor is in contact with a cover via grease or a plate which has thermal conductive properties. In this configuration, heat generated from the motor is transferred in two heat transfer paths, one of which is a path on which heat is transferred to the robot main body via the flange, and the other of which is a path on which heat is transferred to the robot main body via the cover. Accordingly, it is possible to improve the heat dissipation performance of the motor, that is, the cooling performance.

However, the technology in the related art has the following problem.

The robot may adopt a configuration in which the drive unit such as the motor is supported by an arm, and drives a joint portion of the arm, a working shaft in the arm, and the like. At this time, when a structure is adopted in which heat escapes from the drive unit to the arm, the temperature of the entirety of the arm increases, and the arm extends due to thermal expansion, and the accuracy of motion decreases.

SUMMARY

An advantage of some aspects of the invention is to provide a robot in which it is possible to efficiently dissipate heat from a drive unit while preventing a decrease in the accuracy of motion originating from the thermal expansion of an arm.

An aspect of the invention is directed to a robot including: an arm; and a drive unit that is provided in the arm, in which the arm has a first member, and a second member that is in contact with the first member and has thermal conductivity higher than that of the first member, and the second member is in contact with the drive unit.

With this configuration, the second member is provided in such a manner as to be in contact with the drive unit, and dissipates heat from the drive unit supported by the arm. In the aspect of the invention, the first member having thermal conductivity lower than that of the second member is interposed between the arm and the second member, and a heat dissipation path is limited in such a manner that heat is not transferred from the second member to the arm. When the heat dissipation path from the second member to the arm is limited in this manner, the amount of heat dissipated from the second member increases relatively, and thereby it is possible to efficiently dissipate heat from the drive unit. For this reason, it is possible to prevent an increase in the temperature of the entirety of the arm, and it is possible to prevent a decrease in the accuracy of motion originating from the thermal expansion of the arm.

In the robot according to the aspect of the invention, the arm may have a first arm portion, and a second arm portion that can turn with respect to the first arm portion, and the drive unit, the first member, and the second member may be provided in at least one of the first arm portion and the second arm portion.

With this configuration, when the arm includes the first arm portion and the second arm portion, it is possible to efficiently dissipate heat from the drive unit which is provided in at least one of the first arm portion and the second arm portion.

In the robot according to the aspect of the invention, the drive unit, the first member, and the second member may be provided in the first arm portion and the second arm portion.

With this configuration, when the arm includes the first arm portion and the second arm portion, it is possible to efficiently dissipate heat from the drive unit which is provided in each of the first arm portion and the second arm portion.

In the robot according to the aspect of the invention, the second member may have a first heat dissipation portion that is provided in the first arm portion, and a second heat dissipation portion that is provided in the second arm portion, and the first heat dissipation portion may be provided so as to be able to face the second heat dissipation portion.

With this configuration, when the first heat dissipation portion in the first arm portion and the second heat dissipation portion in the second arm portion are provided in such a manner as to face each other, and the first arm portion and the second arm portion turn and overlap each other, it is possible to prevent the thermal expansion of the second arm portion, which originates from heat dissipated from the first heat dissipation portion, and it is possible to prevent the thermal expansion of the first arm portion, which originates from heat dissipated from the second heat dissipation portion.

In the robot according to the aspect of the invention, the first heat dissipation portion may have a plurality of first heat dissipation fins, and the second heat dissipation portion may have a plurality of second heat dissipation fins that are provided in such a manner as to alternate with the plurality of first heat dissipation fins when the second heat dissipation portion faces the first heat dissipation portion.

With this configuration, since the plurality of first heat dissipation fins of the first heat dissipation portion and the plurality of second heat dissipation fins of the second heat dissipation portion are provided in such a manner as to alternate with each other, it is possible to increase heat dissipation areas while avoiding collision between the heat dissipation fins when the first arm portion and the second arm portion turn, and thereby it is possible to efficiently dissipate heat from the drive units.

In the robot according to the aspect of the invention, each of the first heat dissipation fin and the second heat dissipation fin may be formed in a circular arc shape which has a predetermined axial center around which the second arm portion turns.

With this configuration, since each of the first heat dissipation fin and the second heat dissipation fin is formed in a circular arc shape, even though the first heat dissipation fin and the second heat dissipation fin extend in a turning direction of each of the first arm portion and the second arm portion, it is possible to avoid collision between the heat dissipation fins, and thereby it is possible to further increase the heat dissipation areas.

In the robot according to the aspect of the invention, at least one of the first heat dissipation portion and the second heat dissipation portion may be inclined in at least one of turning directions of the second arm portion that turns with respect to the first arm portion.

With this configuration, since the inclined portion is provided in at least one of the first heat dissipation portion and the second heat dissipation portion, when the second arm portion turns with respect to the first arm portion, air streams are formed, and it is possible to efficiently dissipate heat from the drive units.

In the robot according to the aspect of the invention, the first member may be made of a resin material.

With this configuration, since the first member is made of a resin material, it is possible to make the light-weight and low-cost first member.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a robot according to an embodiment of the invention will be described with reference to the accompanying drawings.

Figure 1:
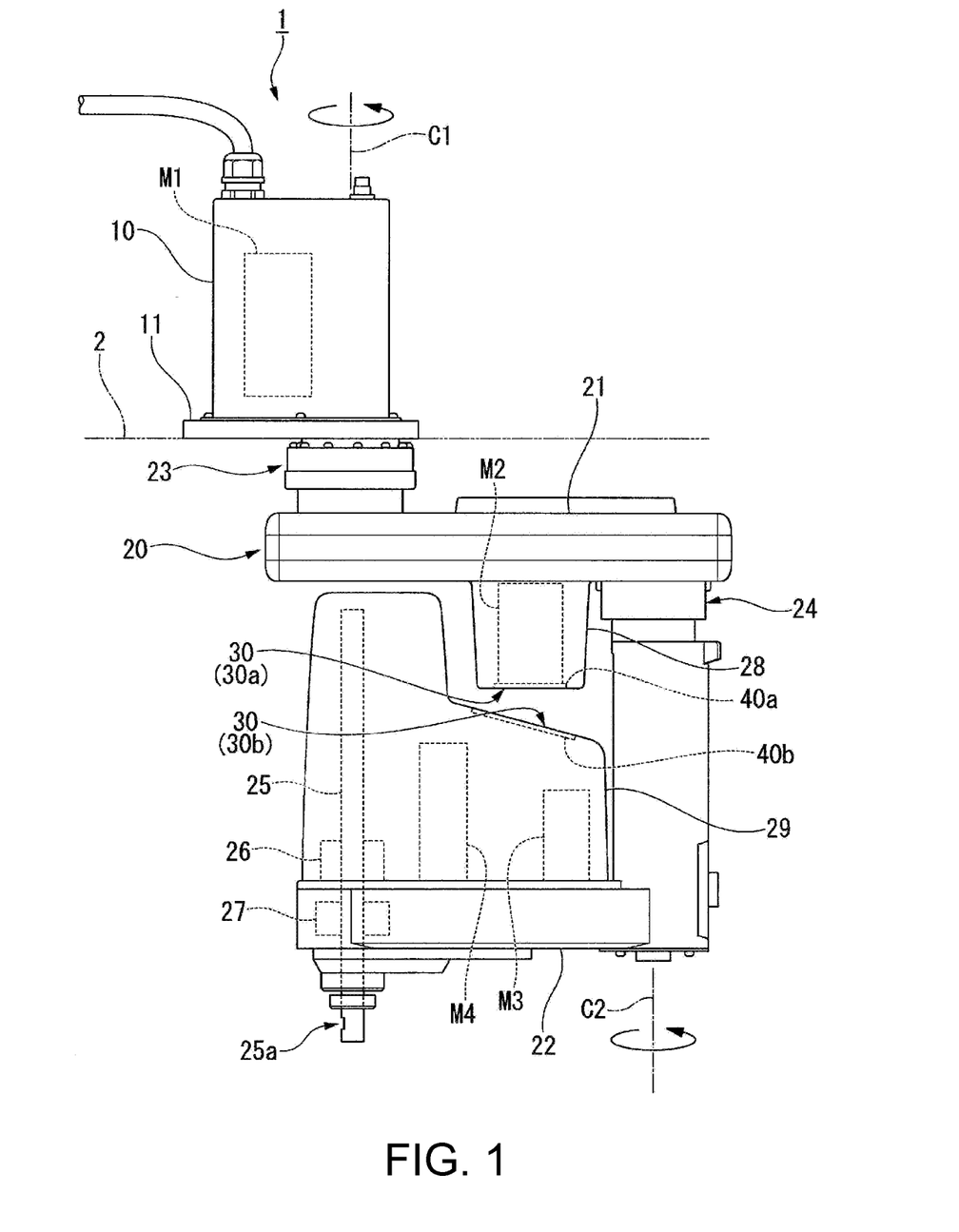
FIG. 1 is a view illustrating the entire configuration of a ceiling mounted robot according to a first embodiment of the invention.

FIG. 1 is a view illustrating the entire configuration of a ceiling mounted robot 1 according to a first embodiment of the invention.

As illustrated in FIG. 1, the ceiling mounted robot (the robot) 1 of the embodiment is a selective compliance articulated robot arm (SCARA) robot that is suspended from a ceiling surface 2. The ceiling mounted robot 1 includes abase 10, and an articulated arm (an arm) 20 that has a movement envelope of at least 360° around the base 10. For example, in the articulated arm 20 of the embodiment, a first arm portion 21 can turn at ±225°, and a second arm portion 22 can turn at ±225°.

The base 10 has an installation portion 11. The installation portion 11 is a plate-like member attached to a lower portion of the base 10. The installation portion 11 is installed on the ceiling surface 2. For example, the ceiling surface 2 is formed of a pair of beam portions of a structural body for installation which is positioned above a work bed. The installation portion 11 is disposed in such a manner as to be laid between the pair of beam portions, and is installed with screw members or the like. A first motor M1 is provided in the base 10, and drives the articulated arm 20.

The articulated arm 20 has the first arm portion 21 and the second arm portion 22. The first arm portion 21 is turnably provided on the base 10 via a first joint portion 23. The first joint portion 23 includes a bearing portion by which the first arm portion 21 is supported in such a manner as to be turnable around an axial center (center of a predetermined shaft) C1, and a speed reducer portion that reduces the rotational speed of the first motor M1. The first arm portion 21 is driven via a speed reducer mechanism that is connected to the first motor M1 via a belt, and the first arm portion 21 can turn around the axial center C1 in a horizontal plane. A second motor (a drive unit) M2 is supported by the first arm portion 21, and drives the second arm portion 22.

The second arm portion 22 is turnably provided on the first arm portion 21 via a second joint portion 24. The second joint portion 24 includes a bearing portion by which the second arm portion 22 is supported in such a manner as to be turnable around an axial center (center of a predetermined shaft) C2, and a speed reducer portion that reduces the rotational speed of the second motor M2. The second arm portion 22 is driven via a speed reducer mechanism that is connected to the second motor M2 via a belt, and the second arm portion 22 can turn around the axial center C2 in a horizontal plane. The second arm portion 22 supports a working shaft (movable shaft portion) 25, and a third motor (a drive unit) M3 and a fourth motor (a drive unit) M4 which drive the working shaft 25.

The working shaft 25 is a shaft for performing predetermined work on the work bed, and an end effector such as a hand device or a welding device can be attached to a lower end portion 25a of the working shaft 25. The working shaft 25 is a hollow columnar shaft body, and a spline groove and a ball screw groove are formed in the circumferential surface of the working shaft 25. A spline nut 26 engages with the spline groove of the working shaft 25. A ball screw nut 27 engages with the ball screw groove of the working shaft 25.

When the spline nut 26 connected to the third motor M3 via a belt rotates, torque is transmitted to the working shaft 25, and the working shaft 25 can rotate around the axial center thereof. When the ball screw nut 27 connected to the fourth motor M4 via a belt rotates, the spline nut 26 stops rotating, and the working shaft 25 can move (linearly move) with respect to the second arm portion 22 in a vertical direction (in a predetermined direction).

In the articulated arm 20, the arm length of the first arm portion 21 is set to be the same as that of the second arm portion 22. The arm length of the first arm portion 21 is the distance between the axial center C1 of the first joint portion 23 and the axial center C2 of the second joint portion 24. The arm length of the second arm portion 22 is the distance between the axial center C2 of the second joint portion 24 and the center of the working shaft 25. The first arm portion 21 and the second arm portion 22 are configured in such a manner as to be able to cross each other without interfering with each other because the respective working planes thereof deviate vertically from each other.

The articulated arm 20 of the embodiment supports the second motor M2, the third motor M3, and the fourth motor M4 which are drive units. For example, the drive unit has an output shaft connected to a predetermined power transmission unit, and an encoder for detecting a rotation angle is provided in a portion of the drive unit, the portion being positioned on the opposite side of the output shaft. The articulated arm is provided with a heat dissipation portion 30 that dissipates heat originating from the drive units. Hereinafter, a configuration will be described with reference to FIG. 2, in which heat is dissipated from the drive units supported by the articulated arm 20 of the drive unit.

Figure 2:
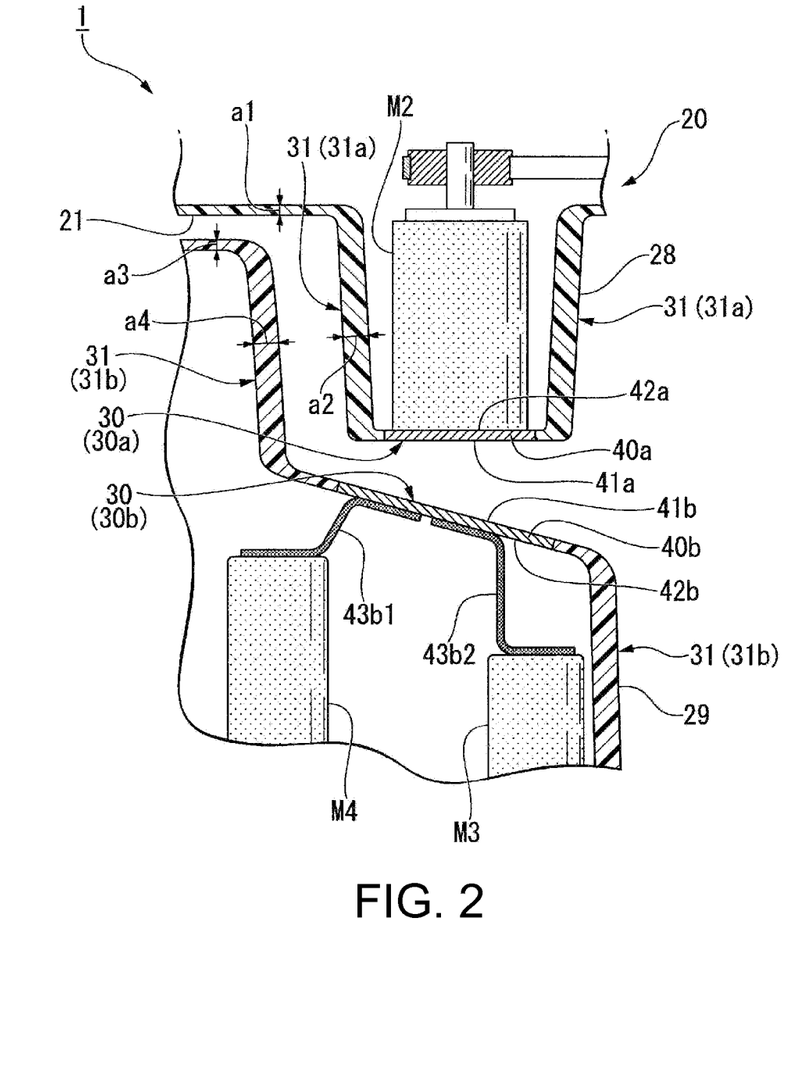
FIG. 2 is an enlarged cross-sectional view illustrating the heat dissipation structure of an articulated arm according to the first embodiment of the invention.

FIG. 2 is an enlarged cross-sectional view illustrating the heat dissipation structure of the articulated arm 20 according to the first embodiment of the invention.

As illustrated in FIG. 2, the articulated arm 20 is provided with the heat dissipation portion (a second member) 30, and a heat dissipation path limiting portion (a first member) 31. The first arm portion 21 extends in a radial direction with respect to the axial center C1, supports the second motor M2, and is provided with a first heat dissipation portion 30a and a first heat dissipation path limiting portion 31a. The second arm portion 22 extends in a radial direction with respect to the axial center C2, supports the third motor M3 and the fourth motor M4, and is provided with a second heat dissipation portion 30b and a second heat dissipation path limiting portion 31b.

The first heat dissipation portion 30a forms at least a part of a cover 28 that covers the second motor M2. As illustrated in FIG. 1, the cover 28 is suspended downward between the first joint portion 23 of the first arm portion 21 and the second joint portion 24. In the embodiment, a bottom portion of the cover 28 is formed of a first heat dissipation plate 40a of the first heat dissipation portion 30a. The first heat dissipation plate 40a includes a member having thermal conductivity higher than that of the cover 28, and in the embodiment, for example, the first heat dissipation plate 40a is made of an aluminum material. When the first heat dissipation plate 40a is made of an aluminum material, the first heat dissipation plate 40a is preferably subjected to a black alumite treatment.

As illustrated in FIG. 2, the first heat dissipation plate 40a has a facing surface 41a that faces the outside of the cover 28 and the second heat dissipation portion 30b. The first heat dissipation plate 40a has a back surface 42a that faces the inside of the cover 28 and is in contact with the second motor M2. The second motor M2 is mounted on the back surface 42a. Heat dissipation grease or the like is preferably applied between the first heat dissipation plate 40a and the second motor M2 with an encoder facing downward so as to increase adhesion therebetween. In this manner, the first heat dissipation portion 30a forms a heat dissipation path on which heat is dissipated from the second motor M2 to the outside (the atmosphere) via the first heat dissipation plate 40a.

The first heat dissipation path limiting portion 31a is interposed between the first arm portion 21 and the first heat dissipation portion 30a. The first heat dissipation path limiting portion 31a of the embodiment forms a side portion of the cover 28 in such a manner as to surround the first heat dissipation portion 30a. The first heat dissipation path limiting portion 31a is made of a resin material having thermal conductivity lower than that of the first heat dissipation portion 30a, and in the embodiment, for example, the first heat dissipation path limiting portion 31a is made of the same polypropylene material as that of the cover 28. The first heat dissipation path limiting portion 31a is made so as to have thermal resistance higher than that of the first arm portion 21. In the embodiment, a thickness a1 of the first arm portion 21 is set to be smaller than a thickness a2 of the first heat dissipation path limiting portion 31a.

The second heat dissipation portion 30b forms at least a part of a cover 29 that covers the third motor M3 and the fourth motor M4. As illustrated in FIG. 1, the cover 29 protrudes upward in such a manner as to cover a region ranging from a position (the position being separated by a predetermined distance from the second joint portion 24 of the second arm portion 22) to the working shaft 25. In the embodiment, a part of an apex of the cover 29 is formed of a second heat dissipation plate 40b of the second heat dissipation portion 30b. The second heat dissipation plate 40b is made of a metal material having high thermal conductivity, and in the embodiment, for example, the second heat dissipation plate 40b is made of an aluminum material. When the second heat dissipation plate 40b is made of an aluminum material, the second heat dissipation plate 40b is preferably subjected to a black alumite treatment. The second heat dissipation plate 40b is provided so as to be inclined in a longitudinal direction of the second arm portion 22.

As illustrated in FIG. 2, the second heat dissipation plate 40b has a facing surface 41b that faces the outside of the cover 29 and the first heat dissipation portion 30a. The second heat dissipation plate 40b has a back surface 42b that faces the inside of the cover 29 and is in contact with the third motor M3 via a heat transfer member 43b2, and the fourth motor M4 via a heat transfer member 43b1. Each of the heat transfer members 43b1 and 43b2 is made of a metal material having high thermal conductivity, and in the embodiment, for example, each of the heat transfer members 43b1 and 43b2 is made of an aluminum material. Heat dissipation grease or the like is preferably applied between the heat transfer member 43b2 and the third motor M3 with an encoder facing upward and between the heat transfer member 43b1 and the fourth motor M4 with an encoder facing upward so as to increase adhesion therebetween. In this manner, the second heat dissipation portion 30b forms a heat dissipation path on which heat is dissipated from the third motor M3 and the fourth motor M4 to the outside (the atmosphere) via the second heat dissipation plate 40b.

The second heat dissipation path limiting portion 31b is interposed between the second arm portion 22 and the second heat dissipation portion 30b. The second heat dissipation path limiting portion 31b of the embodiment forms a side portion of the cover 29 in such a manner as to surround the second heat dissipation portion 30b. The second heat dissipation path limiting portion 31b is made of a resin material having thermal conductivity lower than that of the second heat dissipation portion 30b, and in the embodiment, for example, the second heat dissipation path limiting portion 31b is made of the same polypropylene material as that of the cover 29. The second heat dissipation path limiting portion 31b is made so as to have thermal resistance higher than those of the apex of the cover 29 and the second arm portion 22. In the embodiment, a thickness a3 of the apex of the cover 29 is set to be smaller than a thickness a4 of the second heat dissipation path limiting portion 31b.

In the above-mentioned configurations, the first heat dissipation portion 30a and the second heat dissipation portion 30b are provided at positions in which the first heat dissipation portion 30a and the second heat dissipation portion 30b can face each other while the second arm portion 22 turns with respect to the first arm portion 21. That is, as illustrated in FIG. 1, the first heat dissipation portion 30a and the second heat dissipation portion 30b have the respective regions that are separated by the same radial distance from the axial center C2. Specifically, in the embodiment, when the working shaft 25 is positioned directly below the first arm portion 21, the first heat dissipation portion 30a and the second heat dissipation portion 30b face each other. The position of the working shaft 25 directly below the first arm portion 21 is defined as a home position of the ceiling mounted robot 1 when on standby or in a cooling operation.

As described above, the ceiling mounted robot 1 of the embodiment includes the first arm portion 21, and the second motor M2 that is provided in the first arm portion 21. The first arm portion 21 has the first heat dissipation path limiting portion 31a, and the first heat dissipation portion 30a that is in contact with the first heat dissipation path limiting portion 31a and has thermal conductivity higher than that of the first heat dissipation path limiting portion 31a. The first heat dissipation portion 30a is in contact with the second motor M2.

In this configuration of the embodiment, the first heat dissipation portion 30a is provided in contact with the second motor M2, and dissipates heat from the second motor M2 supported by the first arm portion 21. In the embodiment, the first heat dissipation path limiting portion 31a has thermal conductivity lower than that of the first heat dissipation portion 30a, is interposed between the first arm portion 21 and the first heat dissipation portion 30a, and limits a heat dissipation path in such a manner that heat is not transferred from the first heat dissipation portion 30a to the first arm portion 21. When the heat dissipation path from the first heat dissipation portion 30a to the first arm portion 21 is limited in this manner, the amount of heat dissipation from the first heat dissipation portion 30a increases relatively, and thereby it is possible to efficiently dissipate heat from the second motor M2. For this reason, it is possible to prevent an increase in the temperature of the first arm portion 21, and it is possible to prevent a decrease in the accuracy of motion originating from the thermal expansion of the first arm portion 21.

In the embodiment, the second heat dissipation portion 30b is provided in such a manner as to be in contact with the third motor M3 via the heat transfer member 43b2, and the fourth motor M4 via the heat transfer member 43b1, and the second heat dissipation portion 30b dissipates heat from the third motor M3 and the fourth motor M4 which are supported by the second arm portion 22. In the embodiment, the second heat dissipation path limiting portion 31b has thermal conductivity lower than that of the second heat dissipation portion 30b, is interposed between the second arm portion 22 and the second heat dissipation portion 30b, and limits a heat dissipation path in such a manner that heat is not transferred from the second heat dissipation portion 30b to the second arm portion 22. When the heat dissipation path from the second heat dissipation portion 30b to the second arm portion 22 is limited in this manner, the amount of heat dissipation from the second heat dissipation portion 30b increases relatively, and thereby it is possible to efficiently dissipate heat from the third motor M3 and the fourth motor M4. For this reason, it is possible to prevent an increase in the temperature of the second arm portion 22, and it is possible to prevent a decrease in the accuracy of motion originating from the thermal expansion of the second arm portion 22.

Accordingly, in the embodiment, when the articulated arm 20 includes the first arm portion 21 and the second arm portion 22, it is possible to efficiently dissipate heat from the drive units (the second motor M2, the third motor M3, and the fourth motor M4) which are provided in the first arm portion 21 and the second arm portion 22.

In the configuration of the embodiment, the heat dissipation portion 30 has the first heat dissipation portion 30a in the first arm portion 21, and the second heat dissipation portion 30b in the second arm portion 22. The first heat dissipation portion 30a is provided so as to be able to face the second heat dissipation portion 30b.

In this configuration of the embodiment, as illustrated in FIG. 1, when the first arm portion 21 and the second arm portion 22 turn and overlap each other, heat is transferred from the second heat dissipation portion 30b to the first heat dissipation portion 30a, and in contrast, as illustrated in FIG. 2, since the first heat dissipation path limiting portion 31a limits heat dissipation paths around the first heat dissipation portion 30a, it is possible to prevent the thermal expansion of the first arm portion 21. Heat is transferred from the first heat dissipation portion 30a to the second heat dissipation portion 30b, and since the second heat dissipation path limiting portion 31b limits heat dissipation paths around the second heat dissipation portion 30b, it is possible to prevent the thermal expansion of the second arm portion 22.

In addition, when the first heat dissipation portion 30a faces the second arm portion 22, air streams are formed in the gap between the second arm portion 22 and the facing surface 41a of the first heat dissipation plate 40a due to the rotation of the second arm portion 22 relative to the first heat dissipation portion 30a, and thereby the first heat dissipation portion 30a can efficiently dissipate heat due to cooling effects associated with the air streams. When the second heat dissipation portion 30b faces the first arm portion 21, air streams are formed in the gap between the first arm portion 21 and the facing surface 41b of the second heat dissipation plate 40b due to the rotation of the first arm portion 21 relative to the second heat dissipation portion 30b, and thereby the second heat dissipation portion 30b can efficiently dissipate heat due to cooling effects associated with the air streams. In addition, since the gap between the facing surface 41a and the facing surface 41b is not uniform, it is possible to obtain cooling effects originating from differences (for example, a flow speed and a flow rate) in the air streams formed therebetween.

In the configuration of the embodiment, the heat dissipation path limiting portion 31 is made of a resin material.

In this configuration of the embodiment, since the heat dissipation path limiting portion 31 is made of a resin material, it is possible to make the light-weight and low-cost heat dissipation path limiting portion 31.

In the configuration of the embodiment, the first heat dissipation portion 30a forms at least apart of the cover 28 that covers the second motor M2.

In this configuration of the embodiment, since the cover 28 made of a resin material and having low thermal conductivity is combined with the first heat dissipation portion 30a, heat can be dissipated without being transferred to the first arm portion 21. It is possible to efficiently dissipate heat from the second motor M2 due to air cooling effects associated with the turning of the first arm portion 21. It is possible to efficiently dissipate heat from the third motor M3 and the fourth motor M4 due to the combination of the second heat dissipation portion 30b with the cover 29, and air cooling effects associated with the turning of the second arm portion 22.

As such, in the ceiling mounted robot 1 of the embodiment, it is possible to efficiently dissipate heat from the drive units (the second motor M2, the third motor M3, and the fourth motor M4) while preventing a decrease in the accuracy of motion originating from the thermal expansion of the articulated arm 20.

Second Embodiment

Subsequently, a second embodiment of the invention will be described. In the following description, the same reference signs are assigned to configuration portions that are the same as or equivalent to those of the above-mentioned embodiment, and the description thereof will be briefly given or omitted.

Figure 3:
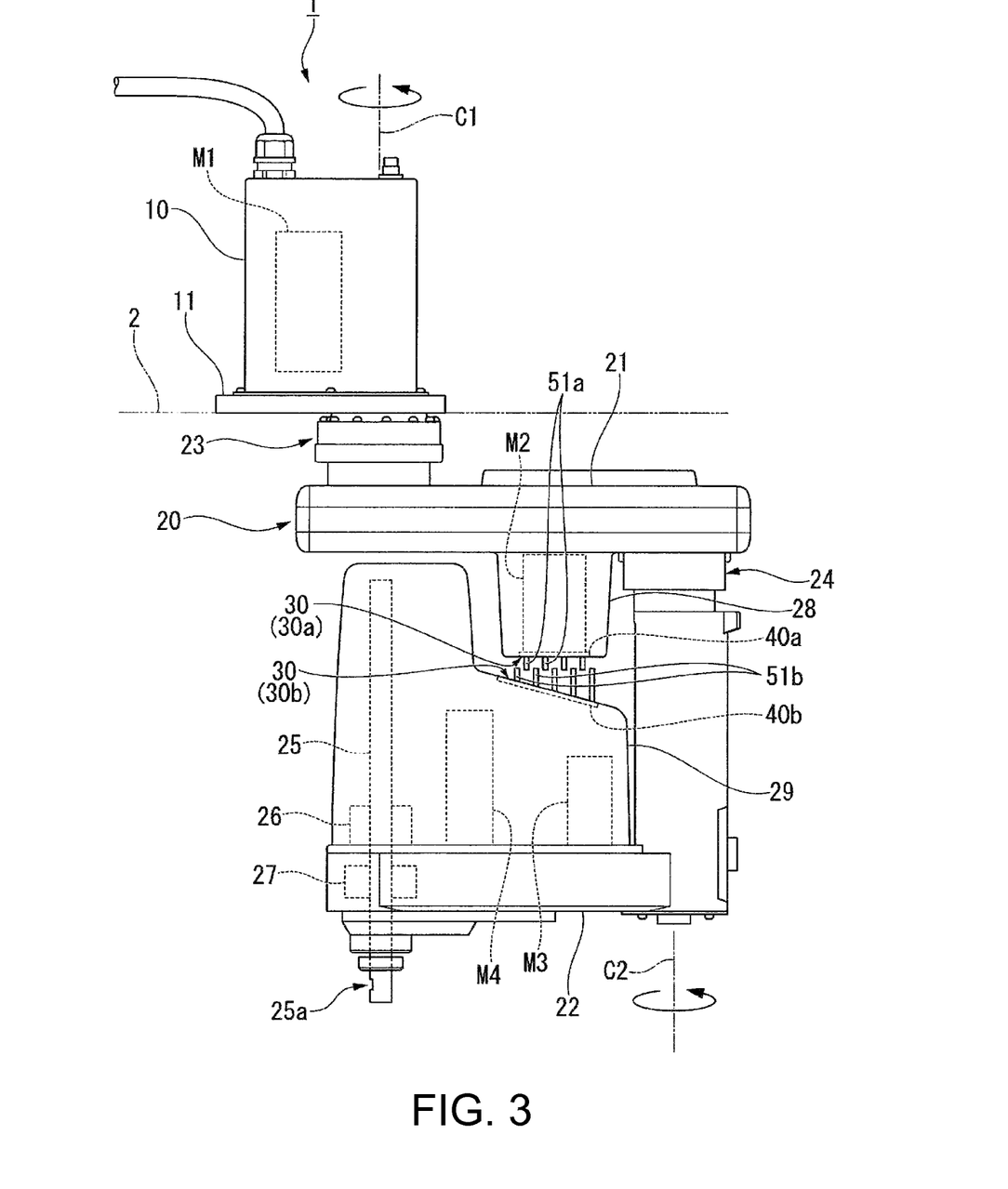
FIG. 3 is a view illustrating the entire configuration of the ceiling mounted robot according to a second embodiment of the invention.
Figure 4:
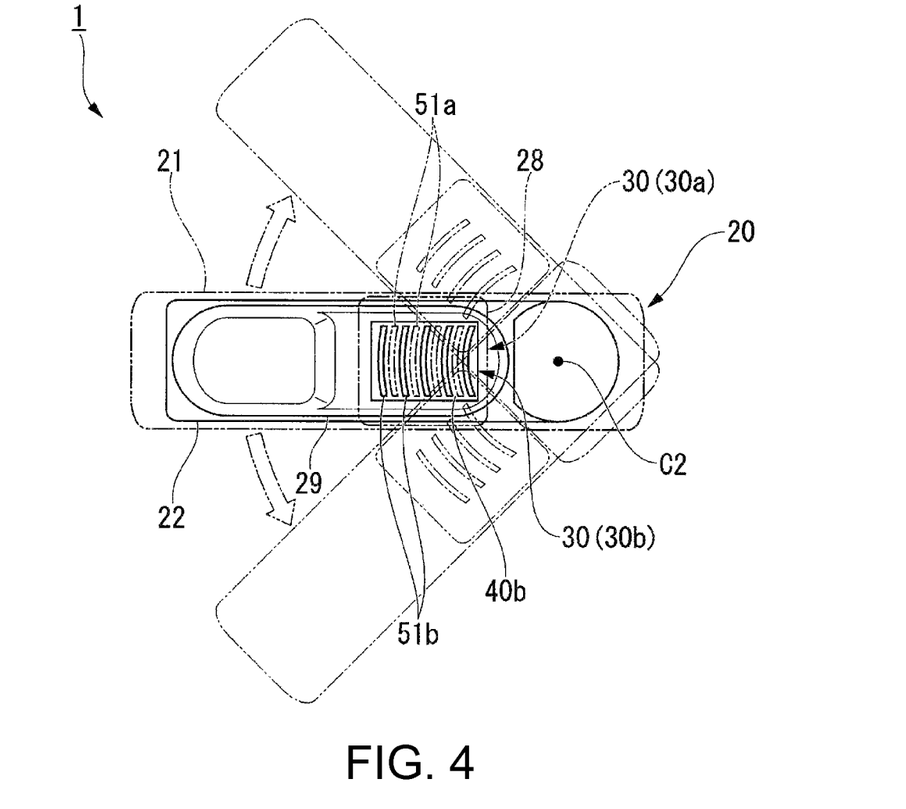
FIG. 4 is a plan view illustrating the heat dissipation structure of the articulated arm according to the second embodiment of the invention.

FIG. 3 is a view illustrating the entire configuration of the ceiling mounted robot 1 according to the second embodiment of the invention. FIG. 4 is a plan view illustrating the heat dissipation structure of the articulated arm 20 according to the second embodiment of the invention.

As illustrated in FIG. 3, the second embodiment is different from the above-mentioned embodiment in that a first heat dissipation fin 51a and a second heat dissipation fin 51b are provided.

The first heat dissipation portion 30a of the second embodiment has a plurality of the first heat dissipation fins 51a. The plurality of first heat dissipation fins 51a are provided in such a manner as to protrude from the first heat dissipation plate 40a, and for example, the first heat dissipation fin 51a is made of the same metal material having high thermal conductivity as that of the first heat dissipation plate 40a. The plurality of first heat dissipation fins 51a line up in the shape of comb teeth along the radial direction with respect to the axial center C1.

In contrast, the second heat dissipation portion 30b of the second embodiment has a plurality of the second heat dissipation fins 51b. The plurality of second heat dissipation fins 51b are provided in such a manner as to protrude from the second heat dissipation plate 40b, and for example, the second heat dissipation fin 51b is made of the same metal material having high thermal conductivity as that of the second heat dissipation plate 40b. The plurality of second heat dissipation fins 51b line up in the shape of comb teeth along the radial direction with respect to the axial center C1.

The plurality of second heat dissipation fins 51b are provided in such a manner as to alternate with the plurality of first heat dissipation fins 51a when facing the first heat dissipation portion 30a. The plurality of second heat dissipation fins 51b are provided in a size such that the tip of each of the second heat dissipation fins 51b overlaps the tip of each of the plurality of first heat dissipation fins 51a in the vertical direction. The plurality of second heat dissipation fins 51b are formed on the inclined second heat dissipation plate 40b in such a manner that the size of the second heat dissipation fin 51b increases further as the second heat dissipation fin 51b approaches the axial center C2. As illustrated in FIG. 4, each of the first heat dissipation fin 51a and the second heat dissipation fin 51b is formed in a circular arc shape which has the axial center C2 as a center around which the second arm portion 22 turns with respect to the first arm portion 21.

In the second embodiment with this configuration, since it is possible to increase the heat dissipation area of the first heat dissipation portion 30a by providing the plurality of first heat dissipation fins 51a, it is possible to efficiently dissipate heat from the second motor M2. In addition, in the second embodiment, since it is possible to increase the heat dissipation area of the second heat dissipation portion 30b by providing the plurality of second heat dissipation fins 51b, it is possible to efficiently dissipate heat from the third motor M3 and the fourth motor M4.

In the second embodiment, as illustrated in FIG. 3, since the plurality of first heat dissipation fins 51a of the first heat dissipation portion 30a and the plurality of second heat dissipation fins 51b of the second heat dissipation portion 30b are provided in such a manner as to alternate with each other, it is possible to increase the heat dissipation areas while avoiding collision between the heat dissipation fins when the first arm portion 21 and the second arm portion 22 turn, and thereby it is possible to efficiently dissipate heat from the drive units.

In the second embodiment, as illustrated in FIG. 4, since each of the first heat dissipation fin 51a and the second heat dissipation fin 51b is formed in a circular arc shape, even though the first heat dissipation fin 51a and the second heat dissipation fin 51b extend in a turning direction of each of the first arm portion 21 and the second arm portion 22, it is possible to avoid collision between the heat dissipation fins, and thereby it is possible to further increase the heat dissipation areas.

Third Embodiment

Subsequently, a third embodiment of the invention will be described. In the following description, the same reference signs are assigned to configuration portions that are the same as or equivalent to those of the above-mentioned embodiment, and the description thereof will be briefly given or omitted.

Figure 5:
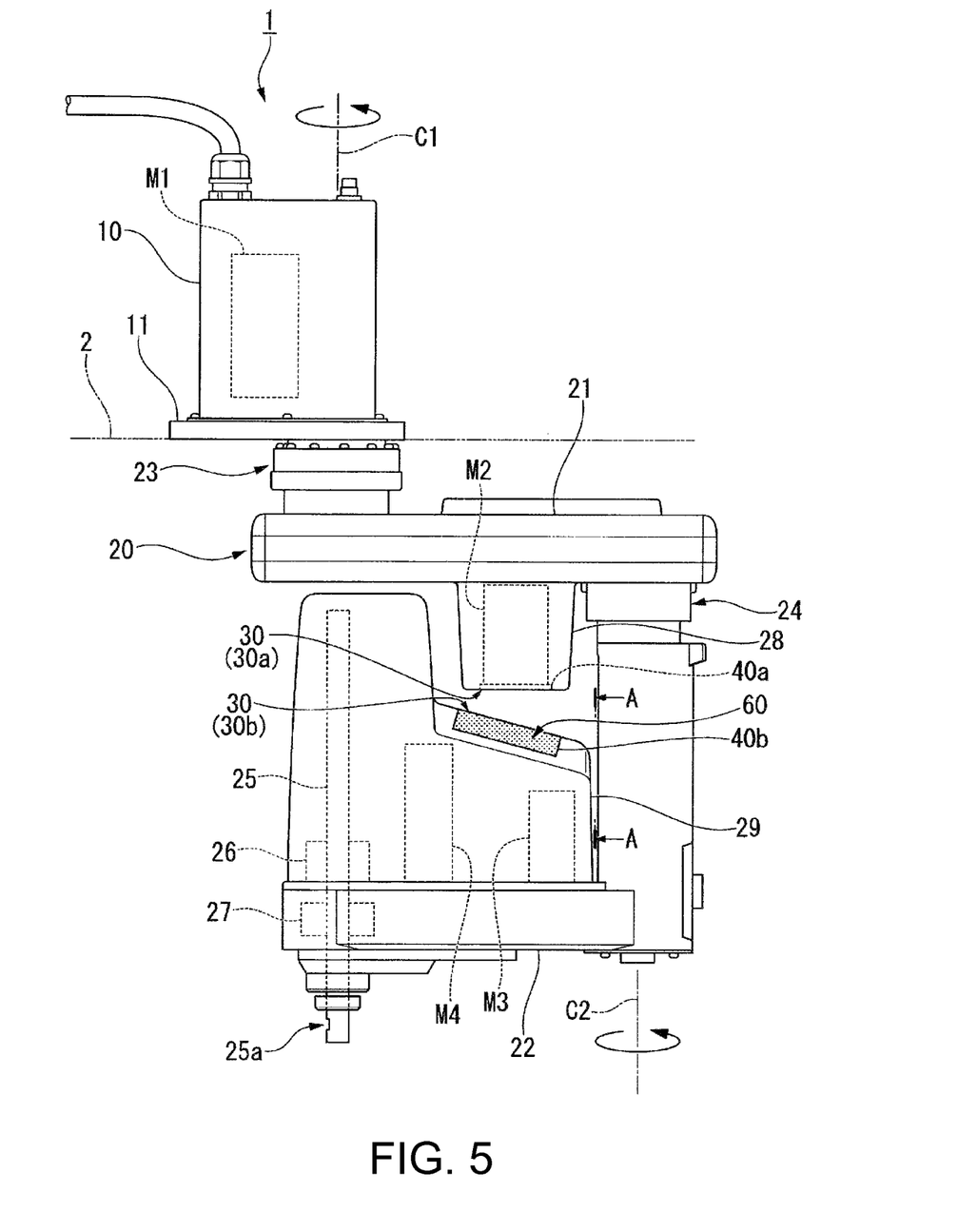
FIG. 5 is a view illustrating the entire configuration of the ceiling mounted robot according to a third embodiment of the invention.
Figure 6:
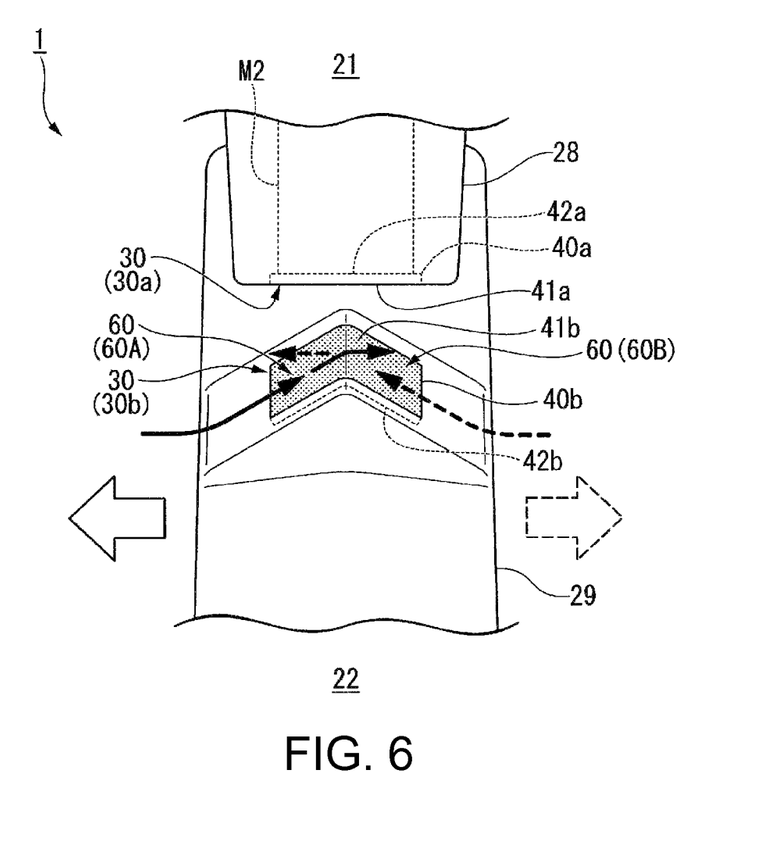
FIG. 6 is a view taken along line A-A in FIG. 5.

FIG. 5 is a view illustrating the entire configuration of the ceiling mounted robot 1 according to the third embodiment of the invention. FIG. 6 is a view taken along line A-A in FIG. 5.

As illustrated in FIG. 5, the third embodiment is different from the above-mentioned embodiment in that an inclined portion 60 is provided.

In the third embodiment, as illustrated in FIG. 5, at least one (the second heat dissipation portion 30b in the example illustrated in FIG. 5) of the first heat dissipation portion 30a and the second heat dissipation portion 30b has the inclined portion 60 that is inclined in at least one of the turning directions of the second arm portion 22 that turns with respect to the first arm portion 21. As illustrated in FIG. 6, an inclined portion 60A is provided in one of the turning directions of the second arm portion 22 that turns with respect to the first arm portion 21, and an inclined portion 60B is provided in the other turning direction.

In the third embodiment with this configuration, when the second arm portion 22 turns with respect to the first arm portion 21 in the direction of a white arrow as illustrated in FIG. 6, air streams are formed due to the inclined portion 60A as illustrated by a solid arrow in FIG. 6. The air streams move upward along the inclined portion 60A, and cool the second heat dissipation portion 30b, and then the air streams are guided to the first heat dissipation portion 30a and also cool the first heat dissipation portion 30a. In the third embodiment, when the second arm portion 22 turns with respect to the first arm portion 21 in the direction of a white dotted arrow as illustrated in FIG. 6, air streams are formed due to the inclined portion 60B as illustrated by a dotted arrow in FIG. 6. The air streams move upward along the inclined portion 60B, and cool the second heat dissipation portion 30b, and then the air streams are guided to the first heat dissipation portion 30a and also cool the first heat dissipation portion 30a.

As such, in the third embodiment, when the second heat dissipation portion 30b is provided with the inclined portion 60, and the second arm portion 22 turns with respect to the first arm portion 21, air streams are formed, and thereby it is possible to efficiently dissipate heat from the drive units (the second motor M2, the third motor M3, and the fourth motor M4). When the inclined portion 60 is provided in the first heat dissipation portion 30a, the same effects are obtained.

A preferred embodiment of the invention is described with reference the accompanying drawings; however, the invention is not limited to the embodiment. In the embodiment, the shape of each configuration member, the combination of the configuration members, and the like are examples, and can be modified in various forms based on design demand and the like insofar as the modifications do not depart from the spirit of the invention.

For example, in the embodiments, the invention is applied to the articulated arm; however, the invention can be applied to a non-articulated arm. The invention can be applied to not only the ceiling mounted robot, but also a robot that is installed on a floor.

The entire disclosure of Japanese Patent Application No. 2014-095735, filed May 7, 2014 is expressly incorporated by reference herein.

What is claimed is:

1. A robot comprising:
a first arm having a first arm cover, the first arm cover being configured with first and second members, the first and second members being continuously connected to each other to form an outer surface of the first arm cover;
a first motor that is provided in an inner space of the first arm cover, the first motor is rotatably connected to the first arm, the first motor having a first side surface and a first bottom surface, the first side surface and the first bottom surface being completely covered by the first arm cover, the first bottom surface of the first motor physically contacting an inner surface of the second member of the first arm cover;
a second arm having a second arm cover, the second arm cover being configured with third and fourth members, the third and fourth members being continuously connected to each other to form an outer surface of the second arm cover;
a second motor that is provided in an inner space of the second arm cover, the second motor is rotatably connected to the second arm so that the second arm rotates relative to the first arm, the second motor having a second side surface and a second bottom surface, the second side surface and the second bottom surface being completely covered by the second arm cover; and
a heat transfer member having first and second parts, the first part being physically connected to the second bottom surface of the second motor, the second part being physically connected to the fourth member of the second arm cover so that heat is transferred from the second motor to the fourth member via the heat transfer member,
wherein the second member has a thermal conductivity that is higher than a thermal conductivity of the first member,
the first side surface of the first motor is spaced apart from an inner surface of the first member of the first arm cover,
wherein the fourth member has a thermal conductivity that is higher than a thermal conductivity of the third member,
the second side surface of the second motor is spaced apart from an inner surface of the third member of the second arm cover,
wherein when the first arm is positioned at a first location relative to the second arm the second member of the first arm cover directly faces the fourth member of the second arm cover,
wherein the second member has a plurality of first heat dissipation fins on an outer surface of the second member,
the fourth member has a plurality of second heat dissipation fins on an outer surface of the fourth member, and
the plurality of second heat dissipation fins are located so as to alternate with the plurality of first heat dissipation fins when the second member of the first arm cover directly faces the fourth member of the second arm cover.

2. The robot according to claim 1,
wherein each of the plurality of first heat dissipation fins and the plurality of second heat dissipation fins is formed in a circular arc shape which has a predetermined axial center around which the second arm rotates.

3. The robot according to claim 1,
wherein at least one of the second member and the fourth member is inclined with respect to turning directions of the second arm that rotates with respect to the first arm.

4. The robot according to claim 1,
wherein the first member is made of a resin material.

5. The robot according to claim 1,
wherein each of the first member and the third member is made of a resin material and each of the second member and the fourth member is made of aluminum.

6. A robot comprising:
a first arm having a first arm cover, the first arm cover being configured with first and second members, the first and second members being continuously connected to each other to form an outer surface of the first arm cover;
a second arm having a second arm cover, the second arm cover being configured with third and fourth members, the third and fourth members being continuously connected to each other to form an outer surface of the second arm cover;
a first motor that is provided in an inner space of the first arm cover, the first motor is rotatably connected to the first arm, the first motor having a first side surface and a first bottom surface, the first side surface and the first bottom surface being completely covered by the first arm cover, the first bottom surface of the first motor physically contacting an inner surface of the second member of the first arm cover; and
a second motor that is provided in an inner space of the second arm cover, the second motor is rotatably connected to the second arm so that the second arm rotates relative to the first arm, the second motor having a second side surface and a second bottom surface, the second side surface and the second bottom surface being completely covered by the second arm cover, the second bottom surface of the first motor contacting an inner surface of the fourth member of the second arm cover, wherein the second member has a plurality of first heat dissipation fins on an outer surface of the second member, the fourth member has a plurality of second heat dissipation fins on an outer surface of the fourth member, and the plurality of second heat dissipation fins are located so as to alternate with the plurality of first heat dissipation fins when the second member of the first arm cover directly faces the fourth member of the second arm cover.

* * * * *